(12) United States Patent
Molloy

(10) Patent No.: US 6,498,571 B2
(45) Date of Patent: Dec. 24, 2002

(54) MULTIPLE STREAM VARIABLE LENGTH ENCODER AND DECODER

(75) Inventor: Stephen A. Molloy, Los Gatos, CA (US)

(73) Assignee: Luxxon Corporation, San Jose, CA (US)

(*) Notice: Subject to any disclaimer, the term of this patent is extended or adjusted under 35 U.S.C. 154(b) by 0 days.

(21) Appl. No.: 09/734,236

(22) Filed: Dec. 8, 2000

(65) Prior Publication Data

US 2002/0006172 A1 Jan. 17, 2002

Related U.S. Application Data

(60) Provisional application No. 60/169,999, filed on Dec. 9, 1999.

(51) Int. Cl.[7] .................................................. H03M 7/40
(52) U.S. Cl. ........................................ 341/65; 395/410
(58) Field of Search ...................... 341/65, 67; 395/410, 395/412, 416

(56) References Cited

U.S. PATENT DOCUMENTS

| | | | | |
|---|---|---|---|---|
| 5,424,733 A | | 6/1995 | Fimoff et al. ................. | 341/67 |
| 5,600,812 A | * | 2/1997 | Park ........................... | 395/410 |
| 5,646,618 A | | 7/1997 | Walsh .......................... | 341/67 |
| 5,686,916 A | | 11/1997 | Bakhmutsky ................. | 341/67 |
| 5,798,719 A | | 8/1998 | Wise et al. .................... | 341/67 |
| 6,076,136 A | * | 6/2000 | Burroughs et al. ............ | 711/5 |

\* cited by examiner

Primary Examiner—Michael Tokar
Assistant Examiner—Joseph Lauture
(74) Attorney, Agent, or Firm—Townsend&Townsend& Crew LLP (57) ABSTRACT

An apparatus may include a first plurality of registers, each register in the first plurality of registers configured to store data wordss, a first selector coupled to the first plurality of registers, the first selector configured to receive a data words stored in each register in the first plurality of registers, and configured to output the data words from a selected register from the first plurality of registers in response to a selection signal, a second plurality of registers, each register in the second plurality of registers configured to store a pointer associated with each register in the first plurality of registers, a second selector coupled to the second plurality of registers, the selector circuit configured to receive data from each register in the second plurality of registers, and configured to output data from a selected register from the second plurality of registers in response to the selection signal, the data comprising a pointer associated with the selected register from the first plurality of registers, a shift register coupled to the first selector and to the second selector circuit, the shift register configured to receive the data words from the selected register in the first plurality of registers, configured to receive the pointer, and configured to output a portion of the data words, the portion of the data words determined by the pointer, and a decoder coupled to the shift register, the decoder configured to receive the portion of the data words, and configured to output decoded data in response to the portion of the data words.

21 Claims, 5 Drawing Sheets

Multiple-stream Variable-length Decoder

MULTIPLE STREAM VARIABLE LENGTH ENCODER AND DECODER

CROSS-REFERENCES TO RELATED APPLICATIONS

The present application claims priority to Application No. 60/169,999 filed Dec. 09, 1999, titled Multiple Stream Variable Length Decoder. That application incorporated by reference for all purposes. The present application also incorporates by reference co-pending application Ser. No. 09/502,409 filed Feb. 10, 2000 for all purposes.

BACKGROUND OF THE INVENTION

The present invention relates to multiple stream switching mechanisms. More particularly, the present invention relates to enhanced context switching for variable length and/or fixed length packets of data. In some embodiments, the switching allows for context switching for two-way, or reversibly, encoded packets of data.

The Internet has provided a wealth of new information and information sources available to users. Typical types of information or data include text articles, images, sounds, videos, and the like. Presently, text articles (.html, .pdf, .txt, and the like), images (.jpg, .gif, .tiff, and the like), and sounds (.wav, .mp3, .pcm, and the like) can be provided to users in a short amount of time, depending upon the data. In other words, the users'connection bandwidth is such that data of this type can be downloaded to the user'client computers in fairly short amounts of time.

Several problems arise, however, with regards to the transfer of video data. One problem with regards to video data is that the user'bandwidth connections to the Internet are often narrow and often video playback is blocky, jumpy, and of poor resolution. As a result, the play back of such video data is often unsatisfactory. Another problem with regards to video data is that many formats for video data are pursued by major Internet companies. For example, streaming video formats are propagated by Microsoft, RealNetworks, Apple Computer, and the like. As a result, users are forced to download and install players for each of the many different formats. Yet another problem with regards to video data is that the processing power of the user'client may vary greatly. For example, the client may be a PDA, a cellular telephone, home computer, and the like. As a result, video servers may be wasting processing power when providing high bandwidth video data for clients with limited bandwidth.

One of the first companies to recognize the above problems was Luxxon Corporation of San Jose, Calif. The solutions proposed by Luxxon included providing servers with the ability to dynamically transcode video sources from one video format to another. Further, the solutions proposed further provided the ability for virtually any video data stream to be converted to a video data stream more consistent with the bandwidth and processing power of the client system. As a result, with the dynamic transcoding processes video data, or the like could be efficiently provided for client systems coupled to the network via telephone modems, via DSL or cable modems, via wireless methods, routers, and the like.

In light of the above, what is desired are methods and apparatus to expand the capabilities of the video servers by adding M to N, source to client processing, while reducing the need for redundant circuitry.

SUMMARY OF THE INVENTION

The present invention relates to M server to N client, multiple stream encoding and decoding mechanisms. More particularly, the present invention relates to enhanced context switching for variable length and/or fixed length packets of data.

According to an aspect of the present invention, an apparatus is described. The apparatus may include a first plurality of registers, each register in the first plurality of registers configured to store data wordss, a first selector coupled to the first plurality of registers, the first selector configured to receive a data words stored in each register in the first plurality of registers, and configured to output the data words from a selected register from the first plurality of registers in response to a selection signal, a second plurality of registers, each register in the second plurality of registers configured to store a pointer associated with each register in the first plurality of registers, and a second selector coupled to the second plurality of registers, the selector circuit configured to receive data from each register in the second plurality of registers, and configured to output data from a selected register from the second plurality of registers in response to the selection signal, the data comprising a pointer associated with the selected register from the first plurality of registers. The apparatus may also include a shifter coupled to the first selector and to the second selector circuit, the shifter configured to receive the data words from the selected register in the first plurality of registers, configured to receive the pointer, and configured to output a portion of the data words, the portion of the data words determined by the pointer, and a decoder coupled to the shifter, the decoder configured to receive the portion of the data words, and configured to output decoded data in response to the portion of the data words.

According to another aspect of the present invention, a method for decoding streams of encoded data is disclosed. The method may include receiving a first stream of encoded data, the first stream from a first source, receiving a second stream of encoded data, the second stream from a second source, storing a first set of data in a first register, the first set of data from the first stream of encoded data, and storing a second set of data in a second register, the second set of data from the second stream of encoded data. The technique may also include storing a first pointer in a third register, the first pointer associated with the first set of data, storing a second pointer in a fourth register, the second pointer associated with the second set of data and applying a first signal to a selector. When the first signal is applied to the selector, coupling the first register and the third register to a shifter, and outputting data with the shifter, the data comprising a portion of the first set of data in response to the first pointer. Further, when the first signal is not applied to the selector, coupling the second register and the fourth register to the shifter, and outputting data with the shifter, the data comprising a portion of the second set of data in response to the second pointer. Decoding the data from the shifter and outputting decoded data may also be included.

According to another aspect of the present invention, an encoding apparatus is disclosed that is configured to receive data input from data sources and offsets associated with the data sources. The apparatus may include a first plurality of registers, each register in the first plurality of registers configured to store data wordss, and a first selector coupled to the first plurality of registers, the first selector configured to receive a data words stored in each register in the first plurality of registers, and configured to output the data words from a selected register from the first plurality of registers in response to a selection signal. The encoding apparatus may also include a second plurality of registers, each register in the second plurality of registers configured to store a pointer, a second selector coupled to the second plurality of registers, the selector circuit configured to receive data from each register in the second plurality of registers, and configured to output data from a selected register from the second plurality of registers in response to the selection signal, the data comprising pointers associated with the data sources, and an accumulator coupled to the second selector, the accumulator configured to combine the pointers associated with the data sources and the offsets. A shift register coupled to the accumulator, the shift register configured to receive the data input, configured to receive output from the accumulator, and configured to output the data input at a shifted position in response to the output from the accumulator, and a logic circuit coupled to the shift register and to the first selector, the logic circuit configured to perform a logic function on the data words from the selected register and output from the shift register are also contemplated. The first plurality of registers is also coupled to the logic circuit and the first plurality of registers is configured to store output from the logic circuit.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DESCRIPTION OF THE SPECIFIC EMBODIMENTS

Figure 1:
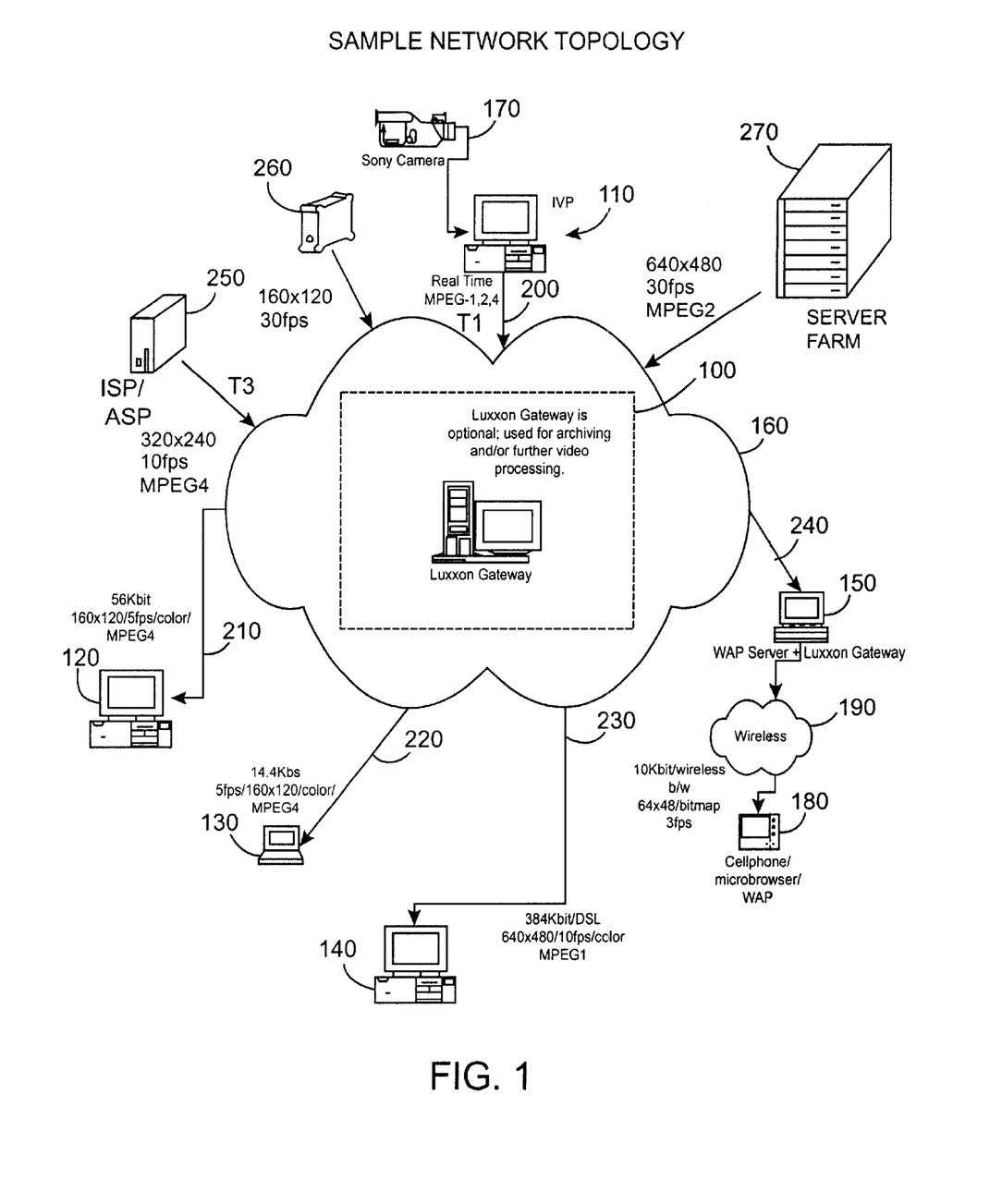
FIG. 1 is a simplified overview diagram of an embodiment of the present invention.

FIG. 1 illustrates a block diagram according to an embodiment of the present invention. FIG. 1 illustrates a gateway computer 100, and plurality of computer systems 110–150 and 250–270 coupled to each other via a computer network 160. In the present embodiment, a video camera 170 is coupled to computer system 110, and a network appliance 180 is coupled via a wireless network 190 to computer system 150. Computer systems 110–150 and 250–270 are coupled to computer network 160 via network connections 200–240 and 280–295.

In the present embodiment, computer network 160 is the Internet. In alternative embodiments of the present invention, computer network 160 may be any computer network, such as an intranet, a computer network, a local area network, an internet, and the like. Computer network 160 is configured to provide data communication among computer systems 110–150, 250–270 and gateway computer 100. Data communication may include transfer of HTML based data, textual data, form submissions, plug-in programs or viewers, applets, audio data, video data, encoded audio/video data, and the like. Although computer network 160 is illustrated as a single entity, as is the case with the Internet, it should be understood that computer network 160 may actually be a network of individual computers and servers.

In the present embodiment, network connections 190–240 have typical maximum bandwidth characteristics that are known a priori. In FIG. 1, for example, network connection 200 is shown as a 1.5 mega bit per second (Mbps) TI connection, as is common with businesses; network connection 210 is shown as a 56 kilobit per second (kbps) connection as is common with home computers, set top boxes, and the like; network connection 220 is shown as a 14.4 kbit (kbps) connection to personal digital assistants (PDAs), such as PalmOS devices, WindowsCE devices, and the like. In this example, network connection 230 is shown as a 384 kbps digital subscriber line (DSL) connection as is common with small businesses or power users. In alternative embodiments, network connection 230 may be smaller or greater than 384 kbps, for example 1 mbps downstream and 500 kbps upstream, or the like. In embodiments of the present invention, other speeds of network connections are envisioned. Further, in practice, many network connection speeds may vary greatly with network traffic, time of day, and the like.

In FIG. 1, network connection 190 is shown as a 10 kbps connection as is currently planned for typical network appliances. The connection rate may vary, and may increase in alternative embodiments of the present invention. For example, alternative embodiments of network appliances may include wireless modems that may range in speeds of up to 128 kbps, and greater, or the like. It is believed that slower rates may be more widely utilized in typical network appliances to keep the cost of such appliances down.

In the present embodiment, computer systems 110, 120, 140, and 150 are embodied as typical personal computers such as those available from companies such as HP, Compaq, IBM, and the like. Such personal computers are typically powered by microprocessors such as the Athlon processor available from AMD and include operating systems such as WindowsME, Windows98, or the like from Microsoft. In alternative embodiments, other personal computers such as those available from Apple or Dell, may also be used. Computer systems 110 and 140 are typically desktop computers. Computer system 120 may be a desktop computer, a laptop computer, a television set top box, such as from WebTV Networks, game consoles such as the Dreamcast, X-Box, PS2, or the like, a network computer, or other types of units incorporating processors, microcontrollers, ASICs, and the like.

Computing systems 110, 120, 140, and 150 are typically connected to computer network 160 via local area networks, via dial-up modems, ISDN, DSL, cable modems, satellite modems, or the like.

In the present embodiment, computer system 130 typically includes PDAs or other portable computing platforms. Such PDAs may operate on a variety of operating system platforms including PalmOS, WindowsCE, or the like. Further, such PDAs operate on a variety of processors. Such devices are typically coupled to computer network 160 via telephone lines or other wire-based network connections.

In the present embodiment, network appliance 180 may include wireless telephones including cellular technology, CDMA, TDMA, and other technologies. In other examples, network appliances may include kiosks, wrist watches, pocket or portable displays or terminals, wearable computers, retinal implants, surveillance equipment, kitchen appliances, and the like.

These devices are typically coupled to computer network 160 via computing system 150 and wireless network 190. In one embodiment of the present invention, computing system 150 is a wireless application protocol server (WAP) that provides data to and from network appliance 180 in the WAP format. In alternative embodiments, other standard and/or proprietary formats may also be used.

In the present embodiment, computer systems 120–140 and network appliance 180 include application software that communicates using the HTTP, TCP/IP, and/or RTP/RTSP protocols. These communication protocols are well known, thus no description is given herein. The application software is typically embodied as a web browser (client), in one embodiment. Further, the software is typically able to display *.gif, and/or *.jpg format images. For computer systems 120 and 140, the web browser software may be embodied as Netscape Navigator, Microsoft's Internet Explorer, or the like. In alternative embodiments of the present invention, other transfer and communication protocols may also be used, for example IPX, or the like. Further, different web client software may be used in other embodiments.

In the present embodiment, it is envisioned that video data will be transferred from computing system 110 or computer systems 250–270 to any one or more of computer systems 120–150 and/or onto network appliance 180. The transferred video data may also originate from gateway computer 100. In one example, video data is stored on computing systems 110, 250–270 in a variety of encoding formats including MPEG1, MPEG2, and MPEG4, as are well known in the art. In alternative embodiments, other video encoding formats are envisioned and may include the Windows *.avi format, the Quicktime *.mov format, or the like. In another embodiment, streaming video formats may be used to provide video data, for example formats from RealNetworks, Microsoft, Apple, or the like. In the present embodiment, the streaming video may be from a stored video archive, or from a live video camera 170, or the like. Whether archived or live, the video is typically output by computing system 110 onto computer network 160. Examples of bandwidth of data streams provided by computer systems 250–270 are illustrated in FIG. 1, however, they should not be construed as limiting any embodiment of the present invention.

As illustrated in the examples in FIG. 1, computing systems 120–140 and network appliance 180 are all coupled to computer network 160 with different bandwidth limited connections. Further, computing systems 120–140 and network appliance 180 typically have different processing power, display capabilities, memory, operating systems, and the like. As a result of these differences, each system have different abilities to receive, process, and display video data.

In the example in FIG. 1, the bandwidth of network connection 230 between computing system 140 and computer network 160 is a DSL connection. As illustrated in FIG. 1, because the bandwidth is relatively large, network connection 230 is capable of providing computing system 140 with enough video data to display up to a 640×480 pixel color image at 10 frames per second (fps) using an MPEG1 format. In alternative embodiments, other configurations are envisioned, for example, 320×240 monochromatic image at 30 fps, or the like.

In the example in FIG. 1, the bandwidth of network connection 210 between computing system 120 and computer network 160 is limited to 56K by the modem. As illustrated in FIG. 1, because the bandwidth is relatively small, network connection 210 is capable of providing computing system 120 with enough video data to display up to a 160×120 color image at 5 fps using an MPEG4 format. As above, in alternative embodiments, other video configurations are envisioned, for example, a 80×60 4-bit image at 25 fps, or the like.

Still further, in the example in FIG. 1, the bandwidth of network connection 220 between computing system 130 and computer network 160 is limited to 14.4 kbps by the modem. As illustrated in FIG. 1, because the bandwidth is small, network connection 220 is capable of providing computing system 130 with enough video data to display up to a 160×120 256 color (8-bit color) image at 5 fps. As above, in alternative embodiments, other video configurations are envisioned, for example, a 80×60 16 gray scale (4-bit) image at 10 fps, or the like.

Also in the example in FIG. 1, the bandwidth of wireless network 190 between network appliance 180 and computer network 160 is limited to 10 kbps. As illustrated in FIG. 1, because the bandwidth is very small, wireless network 190 is capable of providing network appliance 180 with enough video data to display up to a 64×48 black and white image at 3 fps. As above, in alternative embodiments, other video configurations are envisioned, for example, a 32×24 black and white image at 10 fps, or the like.

In the present embodiment, gateway computer 100 is coupled to computer network 160 and is configured to provide video data to computer systems 120–140 and network appliance 180. In particular, in the present embodiment, gateway computer 100 is configured to receive video data from computer systems 110, 250, 260, 270, or the like and to provide video data to each device according to that device's bandwidth limitations, and in the output format desired. In this example, gateway computer 100 delivers a stream of video data to computer system 120 that represents a 160×120 resolution color image at 5 fps, in the MPEG4 format; gateway computer 100 delivers a stream of video data to network appliance 180 that represents a 64×48 resolution black and white image at 3 fps, in a custom format; and the like. Further details regarding gateway computer 100 are given below.

The diagram in FIG. 1 is merely an illustration which should not limit the scope of the claims herein. One of ordinary skill in the art would recognize many other variations, modifications, and alternatives.

Figure 2:
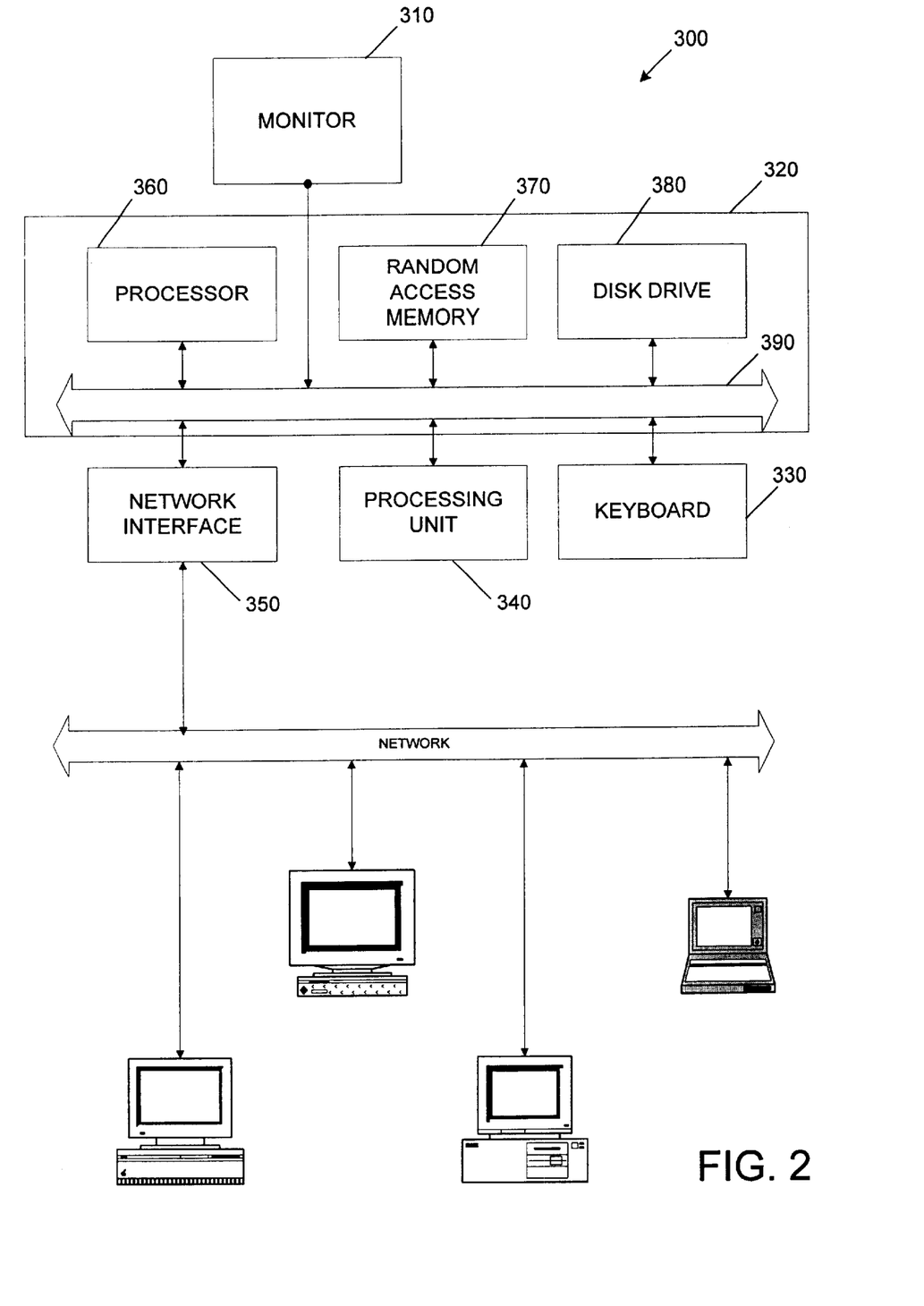
FIG. 2 is a block diagram of an embodiment of the present invention.

FIG. 2 is a block diagram of a typical gateway computer 300 according to an embodiment of the present invention. Gateway computer 300 typically includes a monitor 310, a computer 320, a keyboard 330, a graphical input device, a processing unit 340, a network interface 350, and the like.

In the present embodiment, a graphical input device is typically embodied as a computer mouse, a trackball, a track pad, wireless remote, and the like. Graphical input devices typically allow the users to graphically select objects, icons, text and the like output on monitor 310 in combination with a cursor.

Processing unit 340 is typically embodied as a high bandwidth PC bus, such as the PCI and the like, plug-in card into computer 320. In the present embodiment, processing unit 340 provides much of the functionality that will be described below. Presently, processing unit 340 is a plug-in board, that is not yet currently available from Luxxon Corporation, the assignee of the present invention. In alternative embodiments of the present invention, the functionality provided by processing unit 340 may be implemented on a host computer 320 as software. In such a case, little additional hardware is typically needed.

Embodiments of network interface 350 include an Ethernet card, a modem (telephone, satellite, cable, ISDN), (asynchronous) digital subscriber line (DSL) units, T1 or T3 connection, and the like. Network interface 350 may be coupled to a typical network, such as the Internet via routers, and the like.

Computer 320 includes familiar computer components such as a processor 360, and memory storage devices, such as a random access memory (RAM) 370, a disk drive 380, and a system bus 390 interconnecting the above components.

In one embodiment, computer 320 is a PC compatible computer having an x86 based microprocessor, such as an Athlon™ microprocessor from Advanced Micro Devices, Inc. Further, in the present embodiment, computer 320 typically includes a WindowsNT operating system from Microsoft Corporation.

RAM 370 and disk drive 380 are examples of tangible media for storage of data, audio message files, computer programs, browser software, applet interpreters or compilers, virtual machines, and the like. Other types of tangible media include floppy disks, removable hard disks, optical storage media such as CD-ROMS and bar codes, semiconductor memories such as flash memories, read-only-memories (ROMS), and battery-backed volatile memories, and the like. In embodiments of the present invention such as set top boxes, mass storage, such as disk drive 380, and the like may be dispensed with.

In the present embodiment, gateway computer 300 also includes software that enables it to act as a client that communicates with computer systems 250–270 and a server that communicates with computer systems 120–140 and network appliance 180 using protocols such as HTTP, TCP/IP, RTP/RTSP, and the like. In alternative embodiments of the present invention, other software and transfer and communication protocols may also be used, for example IPX, UDP or the like.

FIG. 2 is representative of but one type of system for embodying the present invention. It will be readily apparent to one of ordinary skill in the art that many other hardware and software configurations are suitable for use with the present invention. For example, other types of processors are contemplated, such as Itanium™-class, Pentium-class or Celeron-class microprocessors from Intel Corporation, K6-x-class microprocessors from Advanced Micro Devices, PowerPC G3, G4 microprocessors from Motorola, Inc., Crusoe™ processors from Transmeta, and the like. Further, other types of operating systems are contemplated, such as Solaris, LINUX, UNIX, MAC OS 9 from Apple Computer Corporation, BeOS, WindowsNT and the like.

Figure 3:
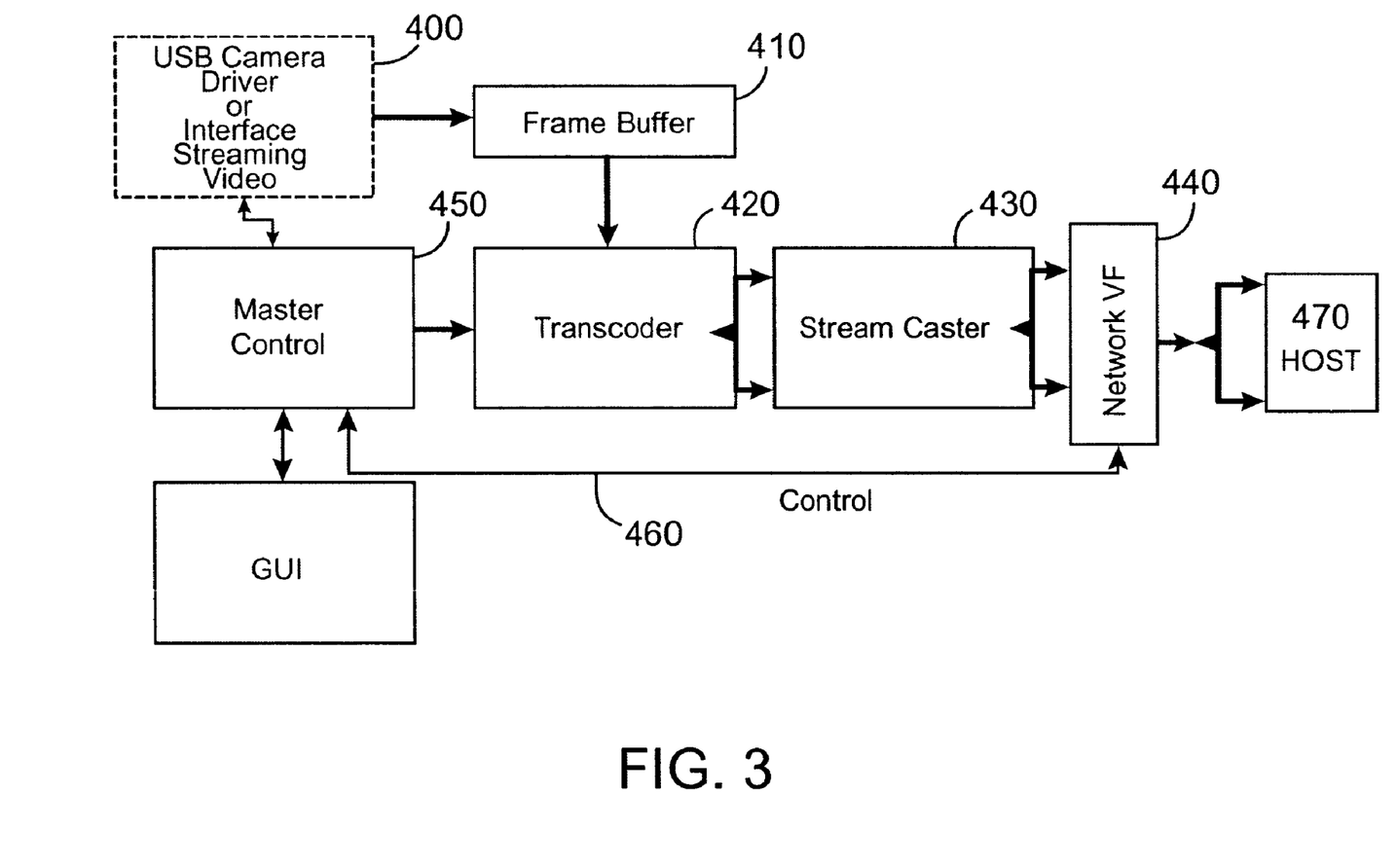
FIG. 3 illustrates a block diagram of an embodiment of the present invention.

FIG. 3 illustrates a block diagram of an embodiment of the present invention. In particular, FIG. 3 illustrates a logical block diagram of one embodiment of processing unit 340, in FIG. 2. FIG. 3 includes one or more video data sources 400, one or more frame buffers 410, a transcoder block 420, a stream caster block 430, a network interface block 440, and a control block 450. These blocks are illustrated coupled to each other and to a computer network 470. Detailed disclosure of embodiments of the present invention are disclosed in co-pending application Ser. No. 09/502,409 filed Feb. 1, 2000. This application is incorporated by reference for all purposes.

Embodiments of the present embodiment may be incorporated into transcoder block 420, as disclosed above, or be inserted at other places in the block diagram. As was described in the above referenced application, transcoder block 420 typically provides the decoding of a data stream, transformation of the data stream, and encoding the transformed data stream. In one example, the decoding of the data may be from MPEG-4 format to an MJPEG format, and in other embodiments, other types of formats, such as MPEG-2, or others may be decoded. In one example, the encoding of transcoded data may be from MJPEG format to an MPEG-4 format, or the like. As described in the patent applications referenced above, in other embodiments, other types of encoding formats, such as MPEG-2, or others may be encoded.

In the present embodiment, typically more than one video data sources 400 are simultaneously provided to processing unit 340, as illustrated in FIG. 3. In order to quickly transcode each of the video data sources 400, embodiments of the present invention include multiple banks of registers to store data associated with each particular data source. The multiple banks of registers and encoding and decoding aspects of transcoder block 420 are described below.

Figure 4:
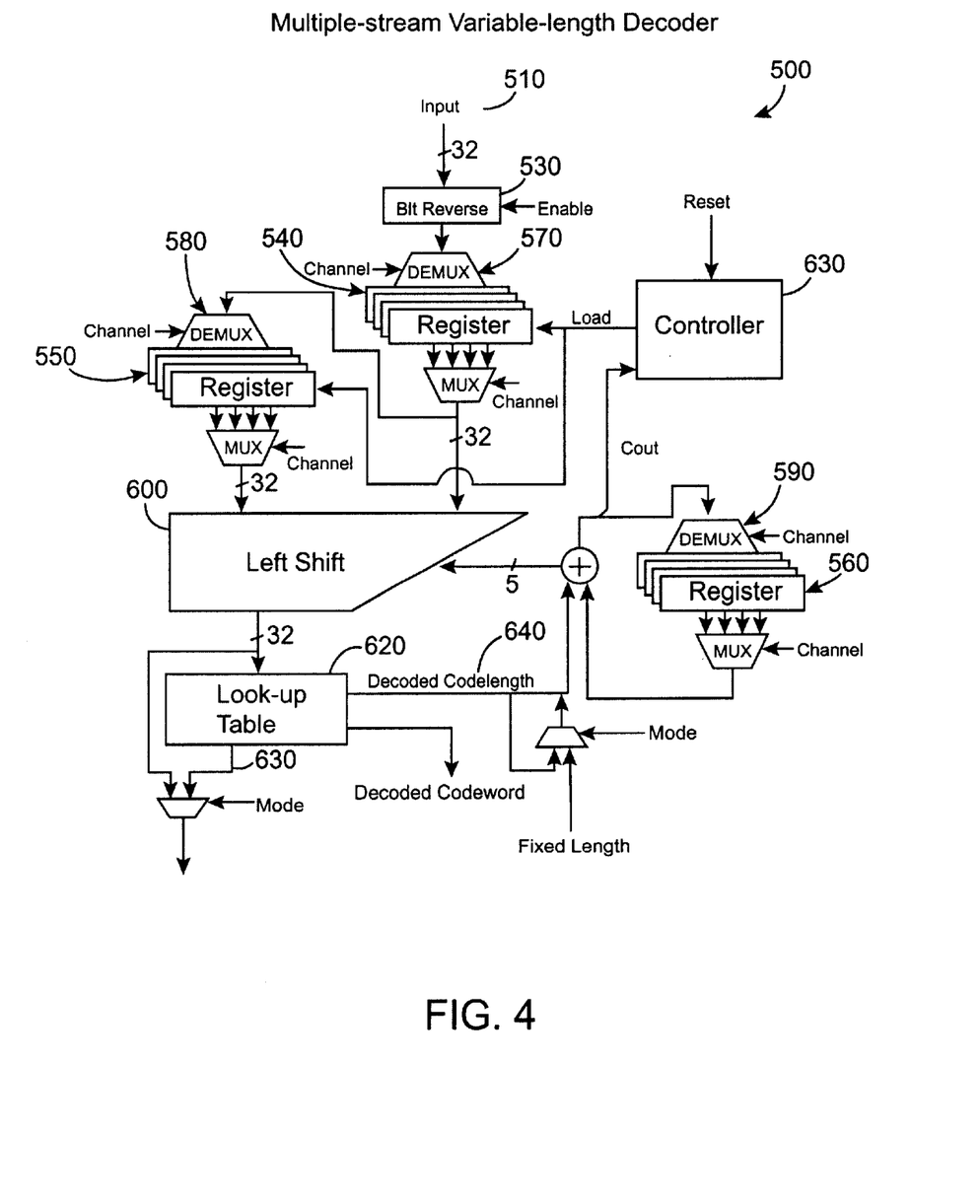
FIG. 4 illustrates a block diagram of an embodiment of the present invention.

FIG. 4 illustrates a block diagram of an embodiment of the present invention. In particular, FIG. 4 illustrates a logical block diagram for a novel multiple stream for a decoding circuit 500. Embodiments of decoding circuit 500 may be implemented in ASICS, custom silicon, or the like.

As illustrated in FIG. 4, in this embodiment, decoding circuit 500 typically receives input data 510 in the form of a 32 bit wide word. In other embodiments, the bit-width may vary. Input data 510 is typically encoded with a variable length encoding scheme such as a Huffman encoding scheme, or the like. In other embodiments, a fixed length encoding scheme, or the like.

In this embodiment, decoding circuit 500 typically also receives a channel signal 520. The bit-width of channel signal 520 may vary. In one embodiment, channel signal 520 may be 4 bits wide, 5 bits wide, 6 bits wide, or the like. In some embodiments, channel signal 520 may be from 10–12 bits wide, or greater. As will be illustrated below, channel signal 520 specifies from which channel input data 510 derives from. For example, at time 0, input data 510 is associated with a channel signal of "0000;" at time 1, input data 510 is associated with a channel signal of "1101;" at time 2, input data 510 is associated with a channel signal of "1000" or the like.

In the present embodiment, input data 510 is directed to a bit reversal block, 530. When enabled, bit reversal block 530 is used to reverse the order of bits in input data 510. For example, bits 0:31 will be rearranged to bit locations 31:0, respectively. Bit reversal block 530 is typically included in embodiments of the present invention where input data 510 is encoded with "reversible" decoding schemes. Examples of "reversible" decoding schemes includes MPEG4 encoding, and the like. In such cases, input data 510 may be decoded in a forward order, such as 0:31, and input data 510 may be decoded in the reverse order, such as 31:0. By reversing the order of the bits prior to the actual decoding process, the same decoding circuitry, described below, can be used. Further, when not enabled, bit reversal block 530 may be in a pass-through mode. Bit reversal block 530 could be dispensed with in embodiments of the present invention where only a uni-directional encoding scheme is used. Further, when not enabled, bit reversal block 530 may be in a pass-through mode.

FIG. 4 also illustrates a plurality of registers 540 and 550. In the present embodiment, the number of registers in registers 540 and 550 are typically the same, and the number is less than or equal to the number of encodings for channel signal 520. For example, in one embodiment, registers 540 and 550 include 16 registers a piece, and channel signal 520 is 4-bits wide; in another embodiment, registers 540 and 550 include 256 registers a piece, and channel signal 520 is 10-bits wide; other types of combinations are envisioned in other embodiments.

In the present embodiment, registers 540 and 550 are used together to hold two 32-bit wide words of input data 510. As will be explained further below, registers 550 typically hold data from input data 510 that arrives earlier in time than data from input data 510 that is stored in registers 540.

FIG. 4 also includes a plurality of registers 560. In this embodiment, the number of registers 560 is similar to the number of registers 540 and 550. The registers 560 are used to store n-bit wide words. In one embodiment, the number n can be determined by the following relationship $2^n=m$, where m is the bit-width of register 550. As an example, in this embodiment, where m=32, n can be 5, but may be greater; as another example, when the bit-width of register 550 is 128 (m=128), n can be 7, but may be greater. Other embodiments may use different bit-widths, different relationships, and the like.

In the present embodiment, registers 560 are used to store pointer data. As will be illustrated further below, the pointer data is used to point to a location in a shifter memory where the next valid encoded data word begins. In embodiments of the present invention where variable length decoding is implemented, code words vary in length within an input bit stream. Accordingly, where codewords begin in a stream depend upon where the previous code word ends. Thus in this embodiment, a pointer is provided to indicate how long a variable length code word is and also to indicate where the next variable length code word begins.

As illustrated in FIG. 4, selector pairs 570–590 are provided around registers 540–560. In this embodiment, selectors 570–590 may be embodied as multiplexes, and the like, demultiplexors, and the like. In this embodiment, selector pair 570–590 typically receive channel signal 520 and are controlled by the value of channel signal 520. In one example, selector pairs 570 may be 2-bit, 3-bit, 4-bit, and the like multiplexors and demultiplexors.

In this embodiment, demultiplexor 570 receives data from either input data 510 or data from bit reversal block 530, depending upon the specific embodiment. Demultiplexor then sends the data to a register in register 540 specified by channel signal 520. For example, channel signal 520 may provide a word "001" and in response, input data 510 may be stored in a register identified by word "001," for example, register "1."

In this embodiment, multiplexor 570 receives data typically from registers 540. Multiplexor 570 then outputs data from one register, depending upon which register is specified by channel signal 520. For example, channel signal 520 may provide a word "10" and in response, data is output from multiplexor 570 from a register identified by word "10," for example, register "2."

In this embodiment, demultiplexor 580 receives data from the output of multiplexor 570. Similar to above, demultiplexor 580 sends the data to a register in register 550 specified by channel signal 520. In this embodiment, multiplexor 580 receives data typically from registers 550. As above, multiplexor 580 then outputs data from one register, depending upon which register is specified by channel signal 520.

Further, in this embodiment, multiplexor 590 receives data typically from registers 560. As above, multiplexor 590 then outputs data from one register, depending upon which register is specified by channel signal 520. In this embodiment, demultiplexor 590 receives data from an accumulator, as will be described below. Similar to above, demultiplexor 580 then sends the data to a register in register 560 specified by channel signal 520.

An accumulator 610 is illustrated in FIG. 4. In this embodiment, accumulator 610 receives the output of multiplexor 590 and output of a decoder 620. The sum of the above outputs is then input to a shifter 600 and/or stored back into a register 560 specified by channel signal 520. As will be explained below, the accumulator is used to update a pointer location stored in register 560.

In the present embodiment, when accumulator 610 reaches a predetermined number, a overflow or carry out condition occurs. The carry out condition is passed to a controller 630. As will be illustrated below, controller 630 asserts a load command to registers 540 and 550 in response to the load command.

As seen in FIG. 4, the output of multiplexors 570 and 580 are output to shifter 600. In the present embodiment, shifter 600 is a "funnel-type" shifter that outputs a set number of bits each cycle. For example, in this example, shifter 600 receives a 64 bit-wide data input (bits 0:63), and outputs a 32 bit-wide data output. The specific 32 bits output from shifter 600 are determined by the updated pointer location from accumulator 610. For example, shifter 600 may output bits 16:47, bits 4:35, or the like in response to the updated pointer location. In other embodiments, shifter 600 may include a larger or smaller bit width data input, larger or smaller output bit-width, and the like. In this embodiment, output from shifter 600 is to a decoder 620.

In the present embodiment, decoder 620 is a look up table (LUT). In one embodiment, decoder 620 implements a Huffman decoding process, although in other embodiments other types of run length decoding, or the like can also be performed. In response to the output from shifter 600, decoder 620 typically outputs decoded data 630 and a decoded word length 640. In this embodiment, decoded word length 640 is typically the number of bits (a variable) that was recognized as the encoded word. For example if the decoded word was "001", decoded word length 640 would be three; if the decoded word was "100010," decoded word length 640 would be six; and the like. In this embodiment, the decoded data is typically an MPEG encoded codeword.

In the present embodiment, decoder 640 is embodied as a programmable logic array, although in other embodiments decoder 640 may include memory elements, processing elements, and the like. In one embodiment, decoder 640 is termed a codebook, and the decoding process may be termed a codebook look up.

In an alternative embodiment of the present embodiment, the ability to perform fixed length word decoding and variable length word decoding may be provided. As illustrated in FIG. 4, multiplexors 650 and 660 may be provided in the circuit. In such embodiments, multiplexor 650 provides a fixed number as input to accumulator 610. Additionally, with fixed length words, Huffman decoding, or the like provided by decoder 620 may not be required. Instead, the fixed length MPEG encoded codeword is directly output.

In embodiments of the present invention, additional processing is provided to recover the video data by further decoding the MPEG encoded codeword. Details of such processes are known and need not be discussed herein.

In typical operation, input data from a first data source may be stored in registers 540 and 560 and accessed via selection of channel 1, and input data from a second data source may be stored in registers 540 and 560 and accessed via selection of channel 2. Next, if channel 1 is selected, 64 bits of data from the first data source stored in registers 540 and 560 are output to shifter 600. In the initial case the pointer to shifter 600 is 0, thus bits 0:31 are output to decoder 620.

In this example, decoder 620 detects a match of a 5 bit, for example, prefix, and outputs a matching codeword 630. At the same time, decoder 620 outputs a value of 5 as decoded word length 640. The value of 5 is then stored in register 560 specified by channel 1. If additional data is made available from the first data source, this process may repeat. Upon subsequent iterations, the value of register 560 increments according to the next decoded word length 640. For example, if the next code word is 3 bits long, the updated pointer location is 8 (5+3).

In the present embodiment, if accumulator 610 determines an overflow condition, i.e. the new pointer location points to a location other than bits 0:31. In such a case, controller 630 asserts a load signal to registers 540 and 550. In response, the contents of register 540 are copied to register 550, and register 550 receives additional data from the first data source.

Next, in typical operation, if channel 2 is selected for decoding, 64 bits of data from the second data source stored in registers 540 and 560 are output to shifter 600. Again, in the initial case the pointer to shifter 600 is 0, thus bits 0:31 are output to decoder 620.

In this example, decoder 620 detects a match of, for example, a 3 bit prefix, and outputs a matching codeword 630. At the same time, decoder 620 outputs a value of 3 as decoded word length 640. The value of 3 is then stored in register 560 specified by channel 2. If additional data is made available from the second data source, this process may repeat. Upon subsequent iterations, the value of register 560 increments according to the next decoded word length 640. For example, if the next code word is 7 bits long, the updated pointer location is 10 (3+7).

Similar to above, in the present embodiment, if accumulator 610 determines an overflow condition, i.e. the new pointer location points to a location other than bits 0:31. In such a case, controller 630 asserts a load signal to registers 540 and 550. In response, the contents of register 540 are copied to register 550, and register 550 receives additional data from the second data source.

Figure 5:
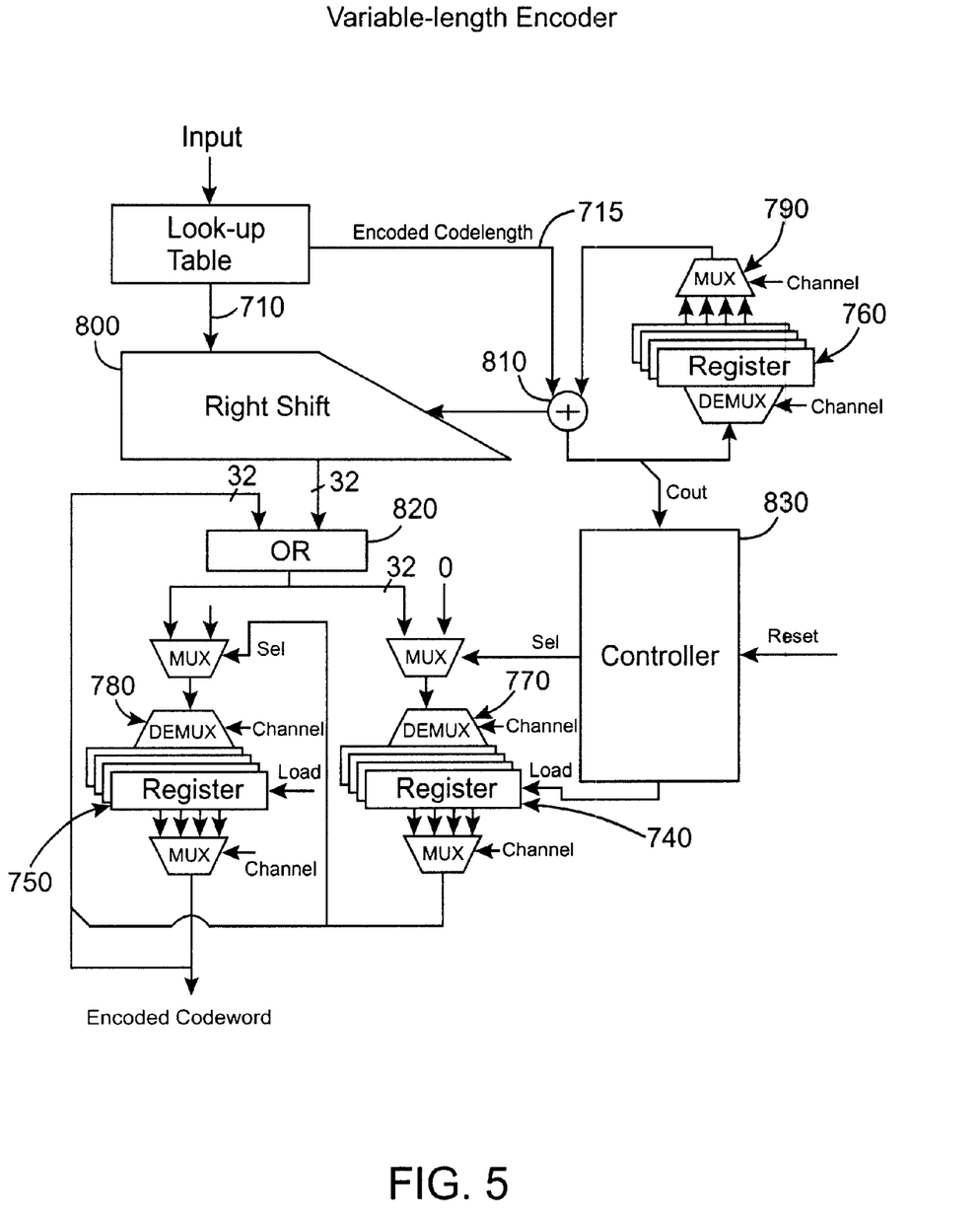
FIG. 5 illustrates a block diagram of an embodiment of the present invention.

FIG. 5 illustrates another block diagram of an embodiment of the present invention. In particular, FIG. 5 illustrates a logical block diagram for a novel multiple stream for a encoding circuit 700. Embodiments of encoding circuit 700 may be implemented in ASICS, custom silicon, or the like.

In FIG. 5, encoding circuit 700 receives input data 710 and a data length 715. Input data 710 and data length 715 are typically derived from a Huffman encoding codebook or other variable length encoding scheme, not shown. In this embodiment, input data 710 thus represents a variable length encoded codeword, and data length 715 represents the number of bits of input data 710. In other embodiments, a fixed length encoding scheme, or the like may be used, thus data length 715 may not be required. The bit width of input data 710 may vary according to the type of Huffman encoding codebook used. For example, input data 710 may be 8 bits wide or more in one embodiment.

In this embodiment, decoding circuit 700 also receives a channel signal 720. The bit-width of channel signal 720 may vary. In one embodiment, channel signal 720 may be any number of bits, such as 2 bits wide, or the like. As will be illustrated below, channel signal 720 specifies to which channel input data 710 will be sent to. For example, at time 0, input data 710 is associated with a channel signal of "10;" at time 1, input data 710 is associated with a channel signal of "01;" and the like.

FIG. 5 also illustrates a plurality of registers 740 and 750. In the present embodiment, the number of registers in registers 740 and 750 are typically the same, and the number is typically less than or equal to the number of encodings for channel signal 720. For example, in one embodiment, registers 740 and 750 include 4 registers a piece, and channel signal 720 is 2-bits wide; in another embodiment, registers 740 and 750 include 64 registers a piece, and channel signal 720 is 6-bits wide; other types of combinations are envisioned in other embodiments.

In the present embodiment, registers 740 and 750 are used together to hold two 32-bit wide words of data. As will be explained further below, registers 750 typically hold data that arrives earlier in time from input data 710 that is stored in registers 740.

FIG. 5 also includes a plurality of registers 760. In this embodiment, the number of registers 760 is similar to the number of registers in registers 740 and 750. The registers 760 are used to store n-bit wide words. In one embodiment, the number n can be determined by the following relationship $2^n=m$, where m is the bit-width of register 750. As another example, when the bit-width of register 750 is 64 (m=64), n can be 6, but may be greater. Other embodiments may use different bit-widths, different relationships, and the like.

In the present embodiment, registers 760 are used to store pointer data. As will be illustrated further below, the pointer data is used to specify the amount of shifting required by a shift register of input data to output data. In embodiments of the present invention where variable length decoding is implemented, code words vary in length within an input bit stream. Accordingly, where codewords should be placed in a output word depends upon where the previous code word finishes. Thus in this embodiment, a pointer is provided to indicate where the next variable length code word will begin.

As illustrated in FIG. 5, selectors 770–790 are provided around registers 740–760. In this embodiment, selectors 770–790 may be embodied as multiplexors, and the like, demultiplexors, and the like. In this embodiment, selector pair 770–790 typically receive channel signal 720 and are controlled by the value of channel signal 720. In one example, selector 770 may be 2-bit, 3-bit, 4-bit, and the like multiplexors and demultiplexors.

As seen in FIG. 5, input data 710 are applied to a shifter 800. In the present embodiment, shifter 800 is also a "funnel-type" shift register. For example, in this example, shifter 800 receives and stores a 7 bit-wide data input (bits 0:6) and outputs a 32 bit-wide data output (bits 0:31). Based upon the updated pointer location from an accumulator 810, the data is right shifted before it is output. For example, if the pointer location is 12, for example, the 7 bit data input may be output on bits 13:19; if the pointer location is 20, the 7 bit data input may be output on bits 21:26; and the like. In this embodiment, shift register 700 may insert leading zeros while shifting the data. In other embodiments, shift register 700 may include a larger or smaller bit width data input, larger or smaller number of shifts, and the like. In the present embodiment, the output from shifter 800 is sent to OR logic 820.

In this embodiment, OR logic 820 performs the logical OR between data previously stored in registers 780 or 770, and/or the output of shifter 800. By performing the logical OR, the output from OR logic 820 represents the concatenation of previous data from data input 710 and the present incoming data from data input 710. Further operational details will be discussed below.

In this embodiment, demultiplexor 790 receives data from an accumulator 810. Demultiplexor 790 then sends the data to a register in register 760 specified by channel signal 720. For example, if channel signal 720 provides a word "10" and input data 715 is "101" the representation of the number 5 may be stored in a register number 2.

In this embodiment, multiplexor 790 receives data from registers 760. Multiplexor 790 then outputs data from one register, depending upon which register is specified by channel signal 720. For example, channel signal 720 may provide a word "01" and in response, data is output from multiplexor 790 from a register number 1."

In this embodiment, demultiplexor 780 receives data from the output of OR logic 820. Similar to above, demultiplexor 780 sends that data to a register in register 750 specified by channel signal 720. In this embodiment, multiplexor 780 receives data from registers 750. As above, multiplexor 780 then outputs data from one register, depending upon which register is specified by channel signal 720.

Further, in this embodiment, multiplexor 770 receives data typically from the output of OR logic 820, a constant, or the like. As above, multiplexor 770 then outputs data from one register, depending upon which register is specified by channel signal 720. As above, multiplexor 790 then outputs data from one register, depending upon which register is specified by channel signal 720.

An accumulator 810 is illustrated in FIG. 5. In this embodiment, accumulator 810 receives the input length 715 and the previous output value from register 760. As will be explained below, the accumulator is used to update a pointer location stored in register 760.

In the present embodiment, when accumulator 610 reaches a predetermined number, a overflow or carry out condition occurs. The carry out condition is passed to a controller 830. As will be illustrated below, controller 630 asserts a load and/or a select command to registers 740 and 750 in response to the load command.

In an alternative embodiment of the present embodiment, the ability to perform fixed length word decoding and variable length word decoding may be provided.

In typical operation, input data from a first data source may arrive as input data 710 and input length 715. For example, input data 710 may be the string "0100" and input length 715 may be 4 or word "100". In the initial case, the pointer stored in register 760 is 0. In response, accumulator 810 outputs the summation of the pointer number and input length 715. This sum is stored back in register 760 at a location specified by channel signal 720. In this case, the number 4 is stored.

Next, shifter 800 outputs a word that includes the input data. For example, bits 0:32 are output with bits 0:3 storing the string "0100." Next, this word is logically ORed with an initialized word having Os. The result of this ORing is then stored in register 750, at the location specified by channel signal 720.

Next, additional input data from the first data source may arrive as input data 710 and input length 715. For example, input data 710 may be the string "111" and input length 715 may be 3. In response, accumulator 810 outputs the summation of the pointer number and input length 715. This sum is stored back in register 760 at a location specified by channel signal 720. In this case, the number 7 is stored.

Next, shifter 800 outputs a word that includes the input data. For example, bits 0:32 are output with bits 4:6 storing the string "111." Next, this word is logically ORed with the data stored in register 780. In this example, the first few bits of the string will then be "0100111 . . ." In this case, the result of this ORing is then stored in register 750, at the location specified by channel signal 720.

As illustrated in FIG. 5, zeros are also written to registers 740 to initialize the contents of registers 740, and registers 750.

The process above may repeat until the carryout signal on accumulator 810 signals an overflow condition. In such an event, it means all bits of register 750 have been written to with data. Accordingly, the data in register 750, specified by channel signal 720 is output as an encoded codeword. Further, register 740 holding the overflowed data bits, is then copied to register 750.

In typical operation, input data may also arrive from a second data source, and the like. In such cases, channel signal 720 is asserted to select a unique register where data is to be stored and encoded into codewords. On a cycle by cycle basis, the source of the input data may be changed, accordingly, channel signal 720 is changed to reflect the input source.

In the foregoing specification, the invention has been described with reference to specific exemplary embodiments thereof. Many changes or modifications are readily envisioned. For example, instead of selector circuits comprising multiplexor and demultiplexor pairs, selector circuits may only comprise demultiplexors. In such embodiments, channel signals are coupled to demultiplexors which in turn are coupled to enable lines coupled to each register. As a result, according to a channel signal, one register in each set of plurality of registers is enabled for loading of data and for reading out of data. Thus although data may be provided to each of the plurality of registers, data is written to and read from only the enabled register.

In another embodiment, selector circuits are embodied only with multiplexors. In such embodiments, loading, or writing to a particular register in a plurality of registers is performed by applying a write enable signal of that particular register. In such embodiments, a controller directly asserts a write enable signal of the selected register, and no demultiplexor is used. The multiplexor is then used, as described above, to select the output of the selected register from the plurality of registers.

In still other embodiments, separate selector circuits may be dispensed with. In such embodiments, the plurality of registers may be register files that directly receive the channel signal and use the channel signal as addressing means. Accordingly, data written to and read from the register file will be from registers addressed by the channel signal.

Embodiments of the above disclosure are believed to be very efficient. For example, by storing data from different data streams in registers, switching contexts from one data source to another can occur virtually every decoding/encoding cycle. It is believed that many cycles would otherwise be wasted when switching contexts because cycles would be lost when the host CPU or other processor performed the tasks of loading data into a register, retrieving data from a cache or main memory, storing data from a register to a cache and to a main memory, or the like. Because these memory transfers would take significant amounts of time, many encoding and/or decoding cycles would be lost in devices not incorporating embodiments of the present invention.

In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. An apparatus comprises:

a first plurality of registers, each register in the first plurality of registers configured to store data packets;

a first selector coupled to the first plurality of registers, the first selector configured to receive a data packet stored in each register in the first plurality of registers, and configured to output the data packet from a selected register from the first plurality of registers in response to a selection signal;

a second plurality of registers, each register in the second plurality of registers configured to store a pointer associated with each register in the first plurality of registers;

a second selector coupled to the second plurality of registers, the selector circuit configured to receive data from each register in the second plurality of registers, and configured to output data from a selected register from the second plurality of registers in response to the selection signal, the data comprising a pointer associated with the selected register from the first plurality of registers;

a shifter coupled to the first selector and to the second selector circuit, the shifter configured to receive the data packet from the selected register in the first plurality of registers, configured to receive the pointer, and configured to output a portion of the data packet, the portion of the data packet determined by the pointer; and a decoder coupled to the shifter, the decoder configured to receive the portion of the data packet, and configured to output decoded data in response to the portion of the data packet.

2. The apparatus of claim 1 wherein a data packet stored in the selected register comprises data from a first data source; and wherein a data packet stored in another register comprises data from a second data source.

3. The apparatus of claim 1 wherein a data packet stored in a first register comprises data from a data source stored in a forward direction from a data source; and wherein a data packet stored in a second register comprises the data from the data source stored in a reverse direction.

4. The apparatus of claim 2 further comprising a channel selector coupled to the first selector and to the second selector, the channel selector configured to assert the selection signal when the data from the first data source is to be decoded.

5. The apparatus of claim 1 wherein the portion of the data packet is encoded in a Huffman encoding scheme; and wherein the decoder is configured to decode Huffman encoded data.

6. The apparatus of claim 1 a third plurality of registers, each register in the third plurality of registers configured to store additional data packets;

a third selector coupled to the third plurality of registers, the third selector configured to receive an additional data packet stored in each register in the third plurality of registers, and configured to output the additional data packet from a selected register from the third plurality of registers in response to a selection signal;

wherein the shifter is also coupled to the third selector, and the shifter is also configured to receive the additional data packet, and is also configured to output a portion of the additional data packet, the portion of the additional data packet determined by the pointer; and wherein the decoder is also configured to receive the portion of the additional data packet, and is configured to output decoded data in response to the portion of the data packet and to the portion of the additional data packet.

7. The apparatus of claim 1 further comprising a third selector coupled to the shifter and coupled to the decoder, the third selector configured to receive the portion of the data packet, the portion of the additional data packet, and the output decoded data, and the third selector configured to output the portion of the data packet and the portion of the additional data packet or the output decoded data in response to a mode selection signal.

8. A method for decoding streams of encoded data comprises:

receiving a first stream of encoded data, the first stream from a first source;

receiving a second stream of encoded data, the second stream from a second source;

storing a first set of data in a first register, the first set of data from the first stream of encoded data;

storing a second set of data in a second register, the second set of data from the second stream of encoded data;

storing a first pointer in a third register, the first pointer associated with the first set of data;

storing a second pointer in a fourth register, the second pointer associated with the second set of data;

applying a first signal to a selector;

when the first signal is applied to the selector, coupling the first register and the third register to a shifter, and outputting data with the shifter, the data comprising a portion of the first set of data in response to the first pointer;

when the first signal is not applied to the selector, coupling the second register and the fourth register to the shifter, and outputting data with the shifter, the data comprising a portion of the second set of data in response to the second pointer; and decoding the data from the shifter and outputting decoded data.

9. The method of claim 8 wherein decoding the data from the shifter also comprises outputting a code length; and wherein the method further comprises when the first signal is applied to the selector, updating the first pointer in the third register in response to the code length.

10. The method of claim 8 wherein decoding the data comprises performing a Huffman decoding on the data from the shifter.

11. The method of claim 8 wherein when the first signal is applied to the selector, outputting data with the shifter comprises outputting a string of bits from the first set of data, an end bit from the string of bits determined by the first pointer;

wherein a number of bits in the string of bits is predetermined.

12. The method of claim 8 updating the first set of data stored in the first register in response to data from the first stream and to the code length.

13. The method of claim 8 wherein the first stream of encoded data and the second stream of encoded data are bit reversed relative to each other.

14. An encoding apparatus configured to receive data input from data sources and offsets associated with the data sources comprises a first plurality of registers, each register in the first plurality of registers configured to store data wordss;

a first selector coupled to the first plurality of registers, the first selector configured to receive a data words stored in each register in the first plurality of registers, and configured to output the data words from a selected register from the first plurality of registers in response to a selection signal;

a second plurality of registers, each register in the second plurality of registers configured to store a pointer;

a second selector coupled to the second plurality of registers, the selector circuit configured to receive data from each register in the second plurality of registers, and configured to output data from a selected register from the second plurality of registers in response to the selection signal, the data comprising pointers associated with the data sources;

an accumulator coupled to the second selector, the accumulator configured to combine the pointers associated with the data sources and the offsets;

a shift register coupled to the accumulator, the shift register configured to receive the data input, configured to receive output from the accumulator, and configured to output the data input at a shifted position in response to the output from the accumulator; and a logic circuit coupled to the shift register and to the first selector, the logic circuit configured to perform a logic function on the data words from the selected register and output from the shift register;

wherein the first plurality of registers is also coupled to the logic circuit and the first plurality of registers is configured to store output from the logic circuit.

15. The encoding apparatus of claim 14 wherein the accumulator is also configured to assert an overflow condition.

16. The encoding apparatus of claim 14 further comprising:

a third plurality of registers coupled to the logic circuit, each register in the third plurality of registers configured to store the output from the logic circuit; and a third selector coupled to the third plurality of registers, the third selector configured to receive a data words stored in each register in the third plurality of registers, and configured to output the data words from a selected register from the third plurality of registers in response to the selection signal.

17. The encoding apparatus of claim 16 further comprising a controller coupled to the third plurality of registers and to the accumulator, the controller configured to cause the data words from the selected register from the third plurality of registers to be stored in the selected register from the first plurality of registers.

18. The encoding apparatus of claim 14 wherein the offsets are selected from the group: a fixed length, a variable length.

19. The encoding apparatus of claim 18 wherein the data input from data sources and offsets associated with the data sources are output from a codebook circuit.

20. The encoding apparatus of claim 19 wherein the codebook circuit implements a Huffman encoding process.

21. The encoding apparatus of claim 14 wherein the first plurality of registers comprise a register file including the first selector.

* * * * *